United States Patent [19]
Trimberger

[11] Patent Number: 5,847,579
[45] Date of Patent: Dec. 8, 1998

[54] PROGRAMMABLE LOGIC ARRAY WITH IMPROVED INTERCONNECT STRUCTURE

[75] Inventor: Stephen M. Trimberger, San Jose, Calif.

[73] Assignee: Xilinx, Inc., San Jose, Calif.

[21] Appl. No.: 821,124

[22] Filed: Mar. 20, 1997

[51] Int. Cl.[6] .............................................. H03K 19/177
[52] U.S. Cl. .............................................. 326/41; 326/39
[58] Field of Search ........................................ 326/37–41

[56] References Cited

U.S. PATENT DOCUMENTS

| | | | |
|---|---|---|---|
| 5,260,611 | 11/1993 | Cliff et al. ............................... | 307/465 |
| 5,371,422 | 12/1994 | Patel et al. ................................. | 326/41 |
| 5,543,732 | 8/1996 | McClintock et al. ...................... | 326/41 |
| 5,550,782 | 8/1996 | Cliff et al. .......................... | 365/230.03 |
| 5,565,793 | 10/1996 | Pedersen .................................... | 326/41 |
| 5,705,939 | 1/1998 | McClintock et al. ...................... | 326/41 |

OTHER PUBLICATIONS

Xilinx, Inc., "Programmable Logic Data Book" 1996, pp. 4–32 to 4–40 No Month.

*Primary Examiner*—Jon Santamauro
*Assistant Examiner*—Don Phu Le
*Attorney, Agent, or Firm*—Anthony C. Murabito; Wagner Murabito & Hao; Jeanette S. Harms

[57] ABSTRACT

A programmable logic array improves connectivity and more efficiently routes signals between logic blocks by allowing programmable connections between each logic block and the horizontal interconnect lines above and below the logic block. Thus, more efficient signal transfer is achieved, particularly when connectivity is required between logic blocks in adjacent rows. The logic array decreases transmission delay and frees up bandwidth on vertical interconnect lines, thereby optimizing the use of routing resources.

21 Claims, 5 Drawing Sheets

PROGRAMMABLE LOGIC ARRAY WITH IMPROVED INTERCONNECT STRUCTURE

BACKGROUND OF THE INVENTION

1. Field of the Invention

The present invention relates to the field of programmable logic array integrated circuits. More specifically, the present invention relates to an improved programmable logic array integrated circuit device which includes improved connectivity between logic blocks.

2. Description of the Related Art

Prior art programmable logic array integrated circuits typically have a general conductor network which interconnects an array of logic blocks, thereby allowing the logic blocks to perform complex logic functions. The general conductor network includes a number of horizontal conductive pathways and a number of vertical conductive pathways which are disposed adjacent to the logic blocks in any given row or column of logic blocks. U.S. Pat. Nos. 5,550,782 and 5,260,611 illustrate programmable logic arrays in which each logic block is coupled to the horizontal conductive pathway directly above the logic block and the vertical conductive pathway adjacent the logic block. In this configuration, each horizontal conductive pathway provides input signals to and receives output signals from the row of logic blocks located directly below the horizontal conductive pathway, and each vertical conductive pathway receives output signals from one column of adjacent logic blocks. Though reference is made to single conductive horizontal and vertical pathways, these conductive pathways are typically made up of numerous conductive lines.

Some prior art devices have special purpose connective lines for connecting adjacent or nearby logic blocks to provide a carry chain. However, such special purpose connective lines are separate from the general conductor network. In addition, an auxiliary network of horizontal and vertical conductors (often called universal fast conductors) may be provided for distribution of certain logic signals used widely throughout the circuit, such as clock and clear signals. However, this auxiliary network is also separate from the general conductor network.

As integrated circuit fabrication processes improve, it becomes possible to make smaller and smaller integrated circuit devices resulting in more logic elements on each programmable logic array integrated circuit device. With the increased number of logic blocks on each integrated circuit device there is a corresponding increase in the number of electronic signals traveling over the conductive pathways of the general conductor network. Thus, it has become critical to maximize the efficiency of the general conductor network and the routing of signals over the general conductor network to reduce signal bottlenecks.

One of the problems with prior art logic arrays in which logic blocks only connect to and communicate over a single horizontal conductive pathway and a single vertical conductive pathway is the amount of time and processing resources required to send signals from a logic block on one row to a logic block on an adjacent row. Unless the logic block includes a special purpose connective line and the function to be performed is one which engages the special purpose connective line, prior art methods for sending a signal to a logic block on an adjacent row requires complex routing of signals over two or more conductive pathways of the general conductor network, thereby consuming valuable communication resources.

FIG. 1 shows a portion of a prior art logic array 100 including logic blocks 120–125. Logic blocks 120–122 are coupled to a horizontal conductive pathway 101. Likewise, logic blocks 123–125 are coupled to a horizontal conductive pathway 102. Vertical conductive pathways 103–105 provide connection between horizontal conductive pathways 101–102 as well as receive signals directly from selected logic blocks and input/output elements. Specifically, vertical conductive pathway 103 is coupled to input/output elements 130–131 and 136–137 as well as logic blocks 120 and 123. Vertical conductive pathway 104 is coupled to input/output elements 132–133 and 138–139 as well as logic blocks 121 and 124. Similarly, vertical conductive pathway 105 is coupled to input/output elements 134–135 and 140–141 as well as logic blocks 122 and 125. Each of horizontal conductive pathways 101–102 is also coupled to one or more of input/output groups 150–153. Specifically, horizontal conductive pathway 101 is coupled to input/output groups 150 and 152, whereas horizontal conductive pathway 102 is coupled to input/output groups 151 and 153. Although each input/output group 150–153 is shown as including two input/output elements, typical embodiments contain more elements, such as eight input/output elements. Conductive lines 180 are used for cascade and carry chain functions.

In logic array 100, to send a signal from logic block 121 to adjacent logic block 124, a signal travels from vertical conductive pathway 104 to horizontal conductive pathway 102. The signal then travels from horizontal conductive pathway 102 to logic block 124. In many prior art logic arrays there is no direct connectivity between every intersecting horizontal and vertical pathway. Therefore, the problem of sending a signal to a logic block on an adjoining row becomes even more complex. For example, if there is no direct coupling between horizontal conductive pathway 102 and vertical conductive pathway 104, the signal must then travel along vertical conductive pathway 104 until an intersection with a horizontal conductive pathway is reached which eventually allows connection to horizontal conductive pathway 102. Thus, as shown in the above examples, in order to make connectivity to a logic block on an adjoining row, a signal may have to travel on a complex path which is dependent on the connectivity between horizontal and vertical conductive pathways.

Other programmable logic array devices, such as the XC4000 Series field programmable gate arrays (FPGAs) made by Xilinx, Inc. of San Jose, Calif., solve the above-described connectivity problem by connecting each logic block to each adjoining horizontal conductive pathway and to each adjoining vertical pathway. The interconnect of the XC4000 Series FPGAs is described in greater detail in the 1996 Programmable Logic Data Book, pages 4–32 to 4–40, published by Xilinx, Inc. However, typical applications may not efficiently use such extensive connectivity. Therefore, the resulting interconnect structure consumes more space on each semiconductor chip than is necessary given many current device densities and programming requirements.

Thus, a need arises for a programmable logic array that optimizes the interconnect structure and the number of interconnections. In particular, an interconnect structure is needed which (1) facilitates further connection between logic blocks, (2) allows for signals to be easily and efficiently transmitted between logic blocks on adjoining rows, (3) minimizes signal travel distances, and (4) optimizes the number of interconnections and the use of routing resources. The present invention provides these advantages.

These and other objects and advantages of the present invention will become apparent to those of ordinary skill in the art in view of the following detailed description of the embodiments which are illustrated in the various figures herein.

SUMMARY OF THE INVENTION

In accordance with the present invention, a programmable logic array includes a general conductor network which connects a logic block to both the horizontal conductive pathway adjacent and above the logic block and to the horizontal conductive pathway adjacent and below the logic block. The logic block is further connected to only one adjacent vertical conductive pathway.

In one embodiment, a general conductor network includes both horizontal and vertical conductive pathways which extend across the logic array. The present invention allows each logic block to receive input signals from and to transfer output signals to the horizontal conductive pathway immediately above the logic block and the horizontal conductive pathway immediately below the logic block, thereby significantly improving the efficiency of sending signals from one logic block to another logic block located on an adjacent row. Specifically, this structure results in faster signal propagation and therefore results in faster processing of logic functions, particularly when the function requires numerous output signals to be used as input signals for logic blocks located on adjacent rows. In addition, since signals are more directly routed between logic blocks, signal degradation is minimized.

Because increased device density necessitates that more and more signals are routed on any given pathway in the general conductor network, the present invention minimizes signal traffic by allowing direct connectivity between each logic block and its adjacent horizontal conductive pathways. Specifically, the present invention decreases signal traffic over vertical conductive pathways and at intersections between horizontal conductive pathways and vertical conductive pathways. The decrease in signal traffic and use of routing resources at intersections of horizontal and vertical conductive pathways results in better processing time and more efficient use of logic processing resources.

BRIEF DESCRIPTION OF THE DRAWINGS

The accompanying drawings illustrate embodiments of the invention and, together with the description, serve to explain the principles of the invention.

DETAILED DESCRIPTION OF THE DRAWINGS

Figure 2:
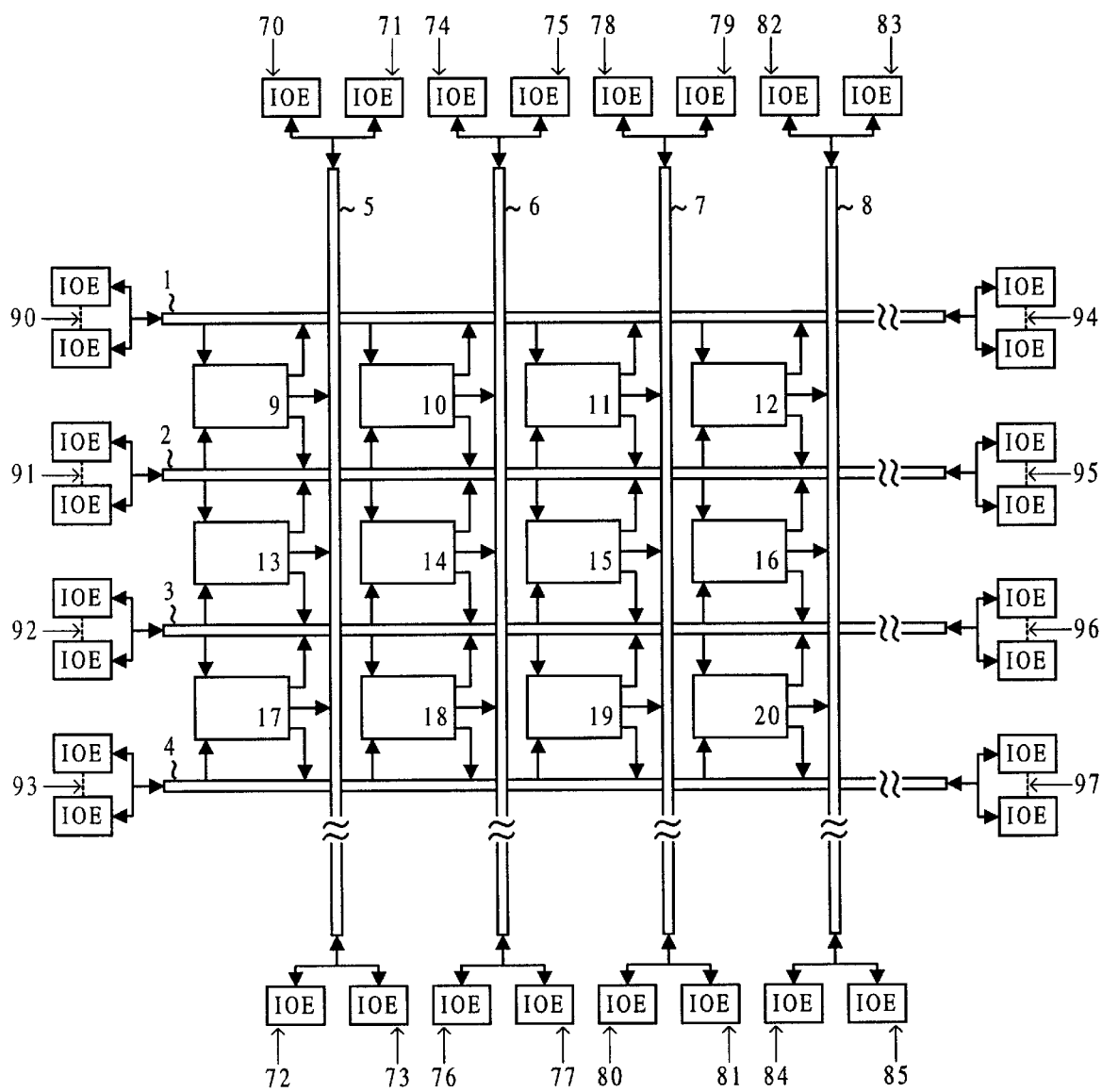
FIG. 2 illustrates a portion of a programmable logic array integrated circuit in accordance with the present invention.

FIG. 2 shows a programmable logic array 200 in accordance with the present invention in which logic blocks 9–20 are connected to horizontal conductive pathways 1–4. Specifically, each logic block is connected to the horizontal conductive pathways above and below it. Thus, in programmable logic array 200, logic blocks 9–12 are connected to horizontal conductive pathways 1 and 2; logic blocks 13–16 are connected to horizontal conductive pathways 2 and 3; and logic blocks 17–20 are connected to horizontal conductive pathways 3 and 4. In further accordance with the present invention, vertical conductive pathways 5–8 are coupled to logic blocks 9–20. Specifically, logic blocks 9, 13, and 17 are coupled to vertical conductive pathway 5; logic blocks 10, 14, and 18 are coupled to vertical conductive pathway 6; logic blocks 11, 15, and 19 are coupled to vertical conductive pathway 7; and logic blocks 12, 16, and 20 are coupled to vertical conductive pathway 8.

Note that each of horizontal conductive pathways 1–4 contain a plurality of horizontal signal lines coupled to input/output elements 90–97; and each of vertical conductive pathways 5–8 contain a plurality of vertical signal lines coupled to input/output elements 70–85. These signal lines may span the length or width of the array or they may be segmented (i.e. some segments may not span the entire width or length of the array). As described in greater detail below, the horizontal signal lines can be programmably coupled to the logic blocks or to the vertical signal lines within the vertical conductive pathways over which the horizontal lines cross.

Input/output elements 70–85 and those contained in input/output groups 90–97 can be used as input, output, or bi-directional pins and are typically placed along the edges of programmable logic array 200. In one embodiment, each of input/output elements 70–85 and those contained in input/output groups 90–97 contains a bi-directional input/output buffer circuit and a register cell that can be used as either an output register cell for data that requires fast clock-to-output performance or as an input register cell for external data that requires a fast setup time.

In the embodiment shown in FIG. 2, vertical conductive pathway 5 is coupled to input/output elements 70–73; vertical conductive pathway 6 is coupled to input/output elements 74–77; vertical conductive pathway 7 is coupled to input/output elements 78–81; and vertical conductive pathway 8 is coupled to input/output elements 82–85. Horizontal conductive pathway 1 is coupled to input/output groups 90 and 94; horizontal conductive pathway 2 is coupled to input/output groups 91 and 95; horizontal conductive pathway 3 is coupled to input/output groups 92 and 96; and horizontal conductive pathway 4 is coupled to input/output groups 93 and 97. In one embodiment, input/output elements 70–85 and those contained in input/output groups 90–97 each contain any number of individual input/output elements, however 8 input/output elements are typically used.

Figure 3:
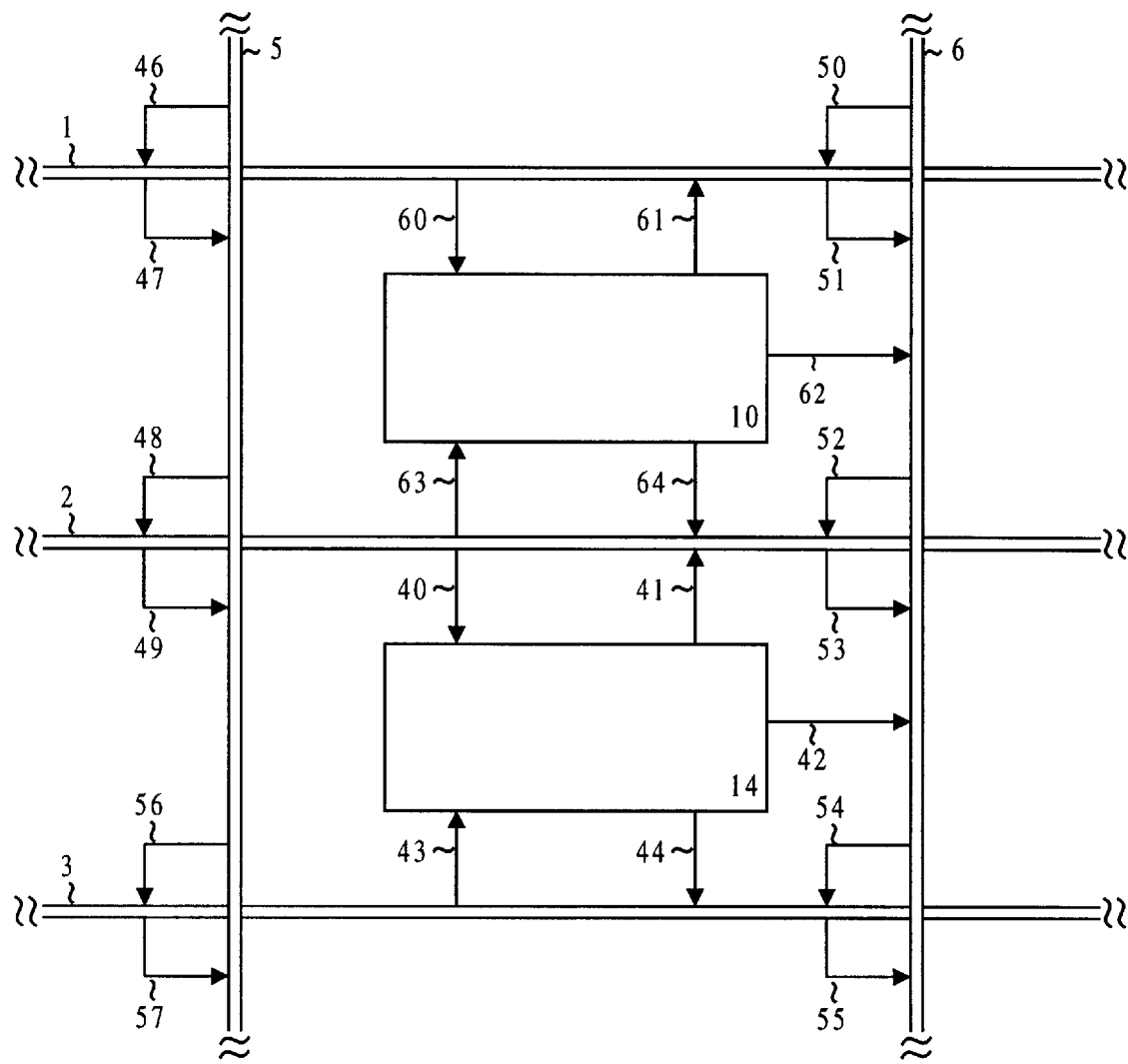
FIG. 3 illustrates an expanded view of a portion of a programmable logic array integrated circuit in accordance with the present invention.

FIG. 3 shows in greater detail a portion of programmable logic array 200 (FIG. 2) in which logic blocks 10 and 14 are connected to horizontal conductive pathways 1, 2 and 3. Specifically, conductive segment 60 provides input signals from horizontal conductive pathway 1 to logic block 10, whereas conductive segment 61 provides output signals from logic block 10 to horizontal conductive pathway 1. Conductive segment 63 provides input signals from horizontal conductive pathway 2 to logic block 10, whereas conductive segment 64 provides output signals from logic block 10 to horizontal conductive pathway 2.

In a similar manner conductive segment 40 provides input signals from horizontal conductive pathway 2 to logic block 14, whereas conductive segment 41 provides output signals from logic block 14 to horizontal conductive pathway 2. Conductive segment 43 provides input signals from horizontal conductive pathway 3 to logic block 14, whereas conductive segment 44 provides output signals from logic block 14 to horizontal conductive pathway 3. Conductive segments 62 and 42 provide output signals from logic blocks 10 and 14, respectively, to vertical conductive pathway 6. Signals are transferred between horizontal conductive pathways 1–3 and vertical conductive pathways 5–6 via conductive segments 46–57. Note that although conductive segments are referred to herein as individual conductive segments, each individual conductive segment may contain multiple lines.

Programmable interconnect points (PIPs) are typically used to programmably connect conductive segments 40–44 and 60–64 with horizontal conductive pathways 1–3 and vertical conductive pathway 6. PIPs may also be used to programmably connect signal lines of horizontal conductive pathways 1–3 and vertical conductive pathways 5–6. Horizontal conductive pathways 1–3 and vertical conductive pathways 5–6 typically include multiple conductive lines, wherein each line may connect to a driver to amplify signals to individual logic blocks. As noted previously, these pathways may span the entire length or width of the array, or they may be segmented.

Figure 1:
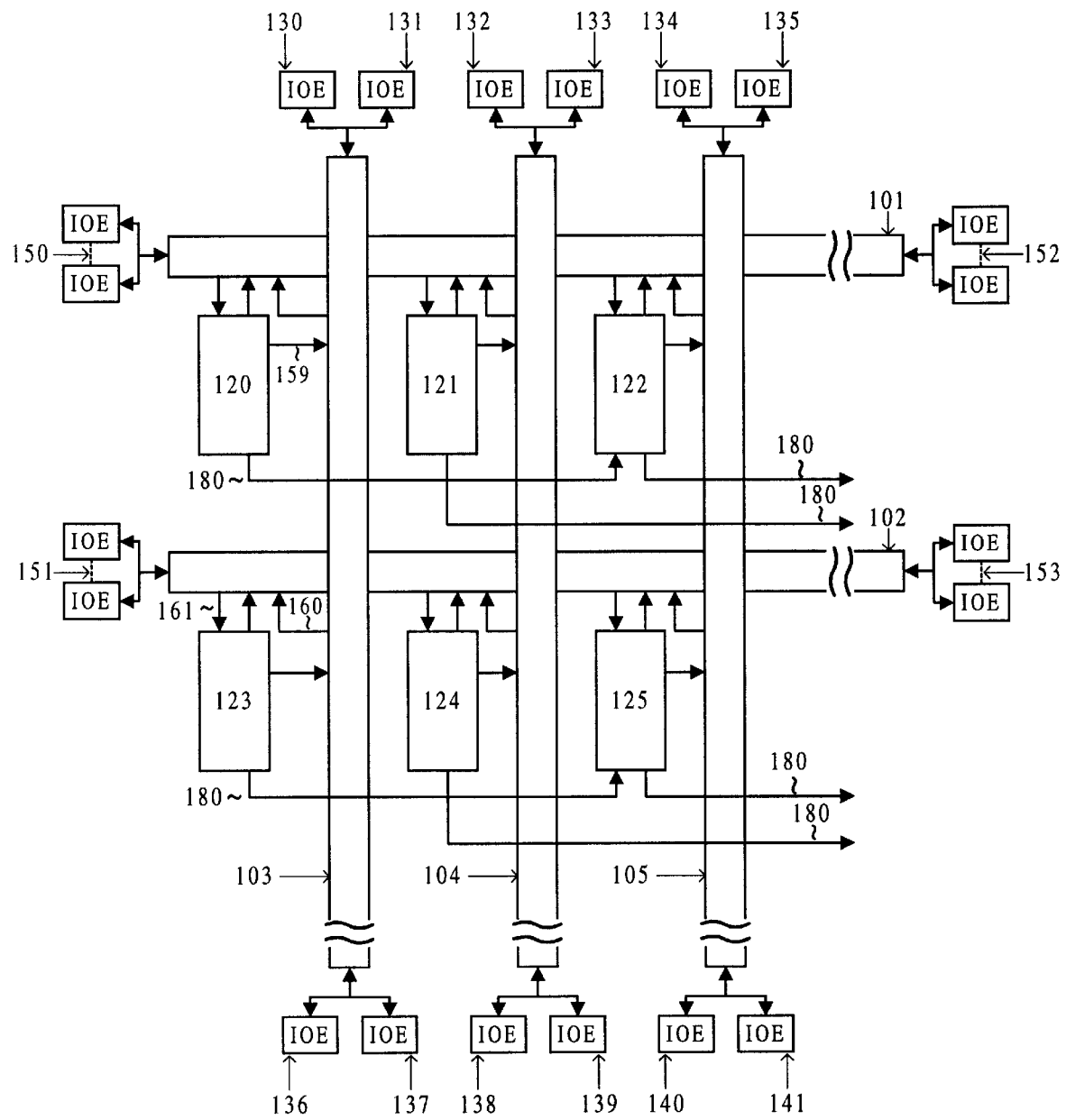
FIG. 1 illustrates a portion of a prior art programmable logic array integrated circuit.

In accordance with present invention, coupling a logic block to the horizontal conductive pathways above and below that logic block eliminates the use of vertical conductive pathways and some associated conductive segments for signals that connect logic blocks in adjacent rows. For example, referring back to FIG. 1, programmable logic array 100 routes a signal from logic block 120 to logic block 123 through vertical conductive pathway 103, conductive segments 159–161, and horizontal conductive pathway 102, thereby consuming valuable vertical conductive pathway resources. In contrast, referring to FIG. 3, the present invention couples the output terminal of logic block 10 to logic block 14 via only conductive segments 64 and 40 and horizontal conductive pathway 2, thereby eliminating signal traffic along vertical conductive pathway 6 and conductive segment 52. In this manner, the present invention allows other signal traffic to use the full bandwidth of vertical conductive pathway 6 and conductive segment 52.

Figure 4:
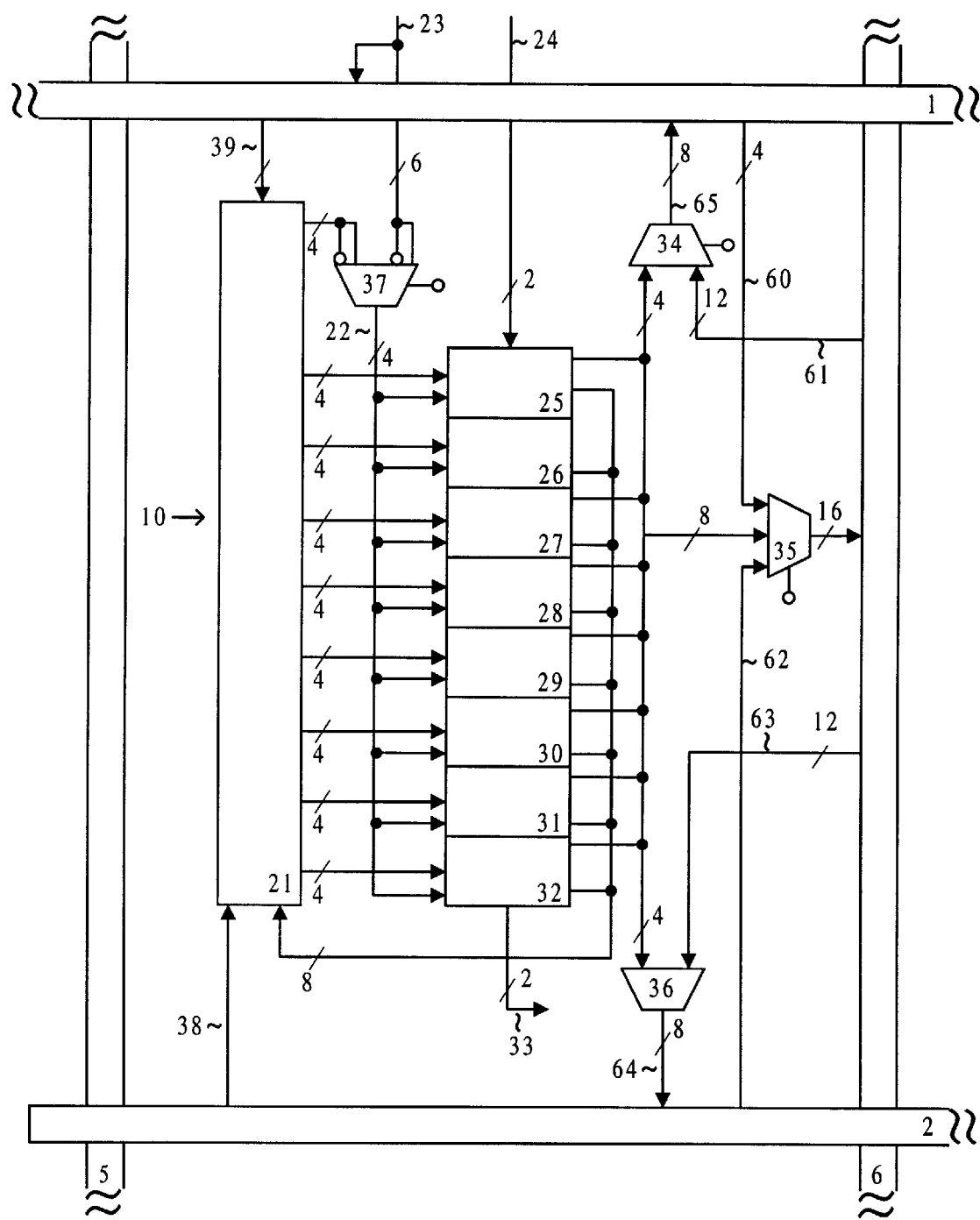
FIG. 4 shows an expanded view of a logic block and adjoining horizontal and vertical conductive pathways in accordance with the present invention.

Any number of different and well known logic blocks can be used effectively within the scope of the present invention. FIG. 4 illustrates an exemplary logic block 10 including logic elements 25–32. Conductive segments 38 and 39 provide input signals from horizontal conductive pathways 1 and 2 to logic elements 25–32 via local interconnect 21. Logic elements 25–32 are programmable by an end user to perform a variety of different logic functions. A feedback loop from logic elements 25–32 to local interconnect 21 allows complex logic calculations to be performed. Dedicated input and global signals are received through conductive segment 23 and then are either directly routed to multiplexer 37, are routed through horizontal conductive pathway 1 and local interconnect 21 to multiplexer 37, or are routed through horizontal conductive pathway 1 and local interconnect 21 to logic elements 25–32. Output signals of multiplexer 37 are provided to logic elements 25–32 via conductive segment 22. Conductive segment 33 directly routes signals from logic elements 25–32 to other logic blocks (not shown) for carry and cascade functions. Output signals from logic elements 25–32 are also provided to multiplexers 34, 35, and 36 which in turn provide signals to horizontal conductive pathway 1, vertical conductive pathway 6, or horizontal conductive pathway 2, respectively. Signals from vertical conductive pathway 6 to horizontal conductive pathway 2 are routed via conductive segments 63 and 64 through multiplexer 36, whereas signals from vertical conductive pathway 6 to horizontal conductive pathway 1 are routed via conductive pathways 61 and 65 through multiplexer 34. Signals from horizontal conductive pathways 1 and 2 to vertical conductive pathway 6 are routed through multiplexer 35 via conductive segments 60 and 62, respectively.

Routing signals through a multiplexer causes signal delay. Moreover, routing signals through multiple multiplexers increases this delay proportionally to the number of multiplexers. In the present invention, signal delay is decreased by routing the signal such that the number of multiplexers through which the signal travels is decreased. Thus, the embodiments shown in FIGS. 3 and 4 minimize signal delay and degradation and save bandwidth of vertical conductive pathways 6 for other signal traffic. Another advantage of the interconnect structure of the present invention is that more logic blocks are coupled to each horizontal interconnect so signals reach logic blocks more quickly. Thus, the interconnect structure of present invention optimizes the number of connections, thereby ensuring both sufficient speed and flexibility to optimally operate in high density devices yet allowing high signal traffic to handle complex functions.

Figure 5:
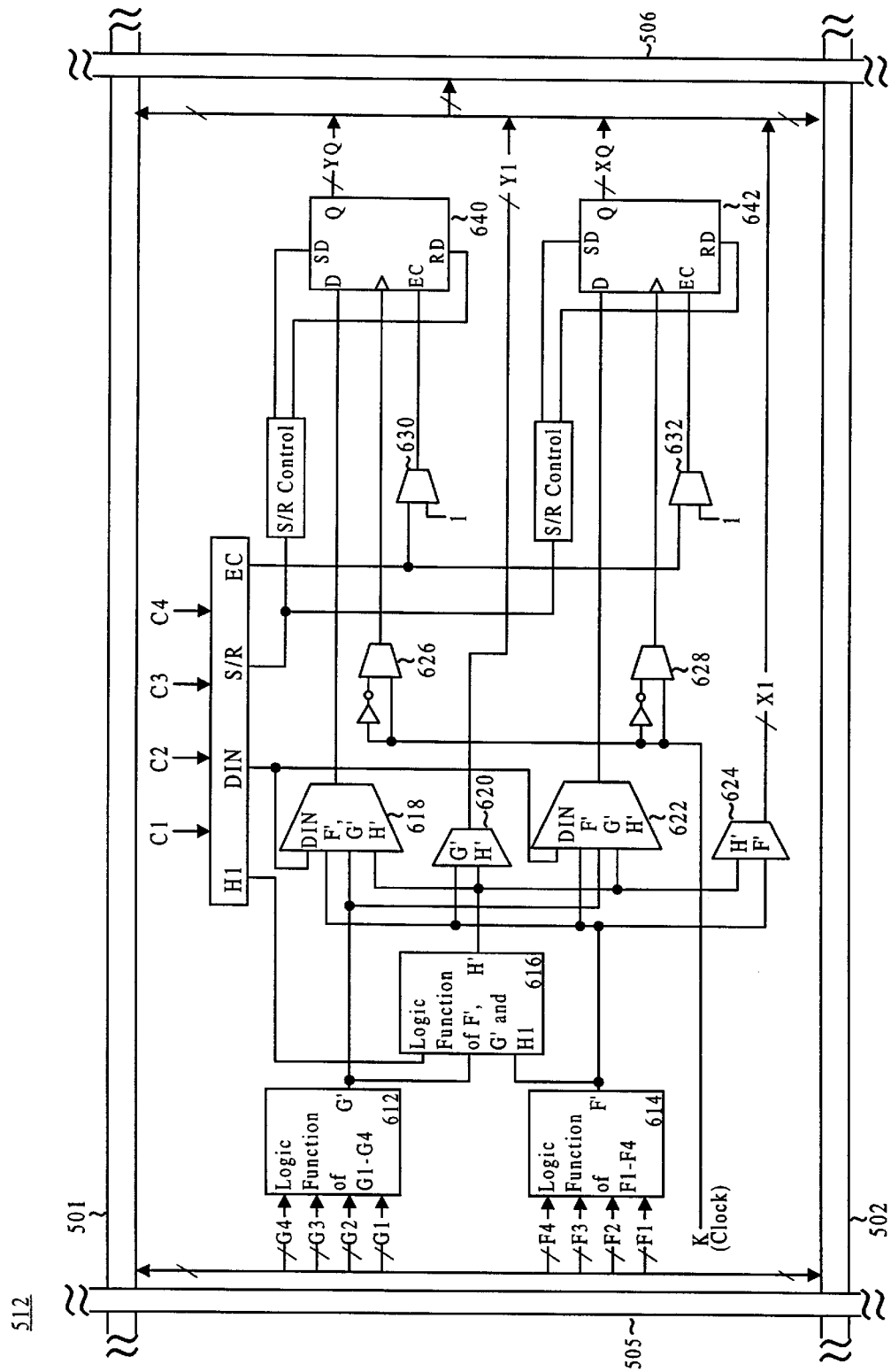
FIG. 5 illustrates an expanded view of a second configurable logic block and adjoining horizontal and vertical conductive pathways in accordance with the present invention.

FIG. 5 illustrates another exemplary logic block 512 that can be used with the present invention. Logic block 512 includes three function generators (in this embodiment, look-up tables) 612, 614, and 616 for generating output signals G', F', and H'. Function generators 612 and 614 receive input signals G1–G4 and F1–F4 from horizontal conductive pathways 501 and 502. Multiplexers 618 and 622, which receive output signals F', G', and H' as well as a data input signal DIN, provide their selected output signals to flip-flops 640 and 642, respectively. Multiplexers 626 and 628 provide signals to clock flip-flops 640 and 642, respectively, whereas multiplexers 630 and 632 provide enable (EC) signals to those flip-flops. Multiplexers 620 and 624 generate X1 and Y1 signals. Output signals X1, Y1, XQ and YQ are provided to horizontal conductive pathways 501 and 502 as well as vertical conductive pathway 506. Programmable memory cells (not shown) control the selection terminals of the multiplexers and configure function generators 612, 614 and 616.

The above descriptions of specific embodiments of the present invention have been presented for purposes of illustration and to provide a thorough understanding of the present invention. They are not intended to be exhaustive or to limit the invention to the embodiments disclosed. Those skilled in the art will recognize modifications and variations in light of the above teaching. The invention is intended to cover the alternatives, modifications, and equivalents which may be included within the spirit and scope of the invention as defined by the appended claims.

I claim:

1. A programmable integrated circuit comprising:

a logic block;

a first set of conductors disposed on a first side of said logic block for programmably supplying first input signals to said logic block and for programmably receiving first output signals from said logic block;

a second set of conductors disposed on a second side, opposite said first side, of said logic block for programmably supplying second input signals to said logic block and for programmably receiving second output signals from said logic block;

a third set of conductors disposed on a third side of said logic block for programmably receiving third output signals from said logic block; and a fourth set of conductors disposed on a fourth side, opposite said third side, of said logic block for only programmably receiving and supplying signals from said first and second sets of conductors.

2. The programmable integrated circuit of claim 1 wherein said third set of conductors programmably receives and supplies signals from said first and second set of conductors.

3. The programmable integrated circuit of claim 1 wherein said logic block includes:
   a plurality of programmable logic elements, each element having an input terminal and an output terminal; and
   a network of conductors connected to the plurality of input terminals, wherein said network of conductors programmably receive signals from said first and second set of conductors, and said plurality of programmable logic elements programmably supply signals to said first, second and third set of conductors.

4. The programmable integrated circuit of claim 3 further comprising a first multiplexer coupled to receive signals from said first set of conductors and said network of conductors and to supply signals to said plurality of programmable logic elements.

5. The programmable integrated circuit of claim 4 further comprising a second multiplexer coupled to receive signals from said plurality of programmable logic elements and to provide signals to said first set of conductors.

6. The programmable integrated circuit of claim 5 further comprising a third multiplexer coupled to receive signals from said plurality of programmable logic elements and to provide signals to said third set of conductors.

7. The programmable integrated circuit of claim 6 further comprising a fourth multiplexer coupled to receive signals from said plurality of programmable logic elements and to provide signals to said second set of conductors.

8. The programmable integrated circuit of claim 5 wherein said second multiplexer is coupled to receive signals from said third set of conductors.

9. The programmable integrated circuit of claim 6 wherein said third multiplexer is coupled to receive signals from said first and second sets of conductors.

10. The programmable integrated circuit of claim 7 wherein said fourth multiplexer is coupled to receive signals from said third set of conductors.

11. The programmable integrated circuit of claim 3 further comprising a first multiplexer coupled to receive signals from said plurality of programmable logic elements and to provide signals to said first set of conductors.

12. The programmable integrated circuit of claim 3 further comprising a first multiplexer coupled to receive signals from said plurality of programmable logic elements and to provide signals to said third set of conductors.

13. The programmable integrated circuit of claim 3 further comprising a first multiplexer coupled to receive signals from said plurality of programmable logic elements and to provide signals to said second set of conductors.

14. The programmable integrated circuit of claim 1 further comprising:
   a plurality of pins attached to said integrated circuit; and
   a first input/output element coupled to said first set of conductors and one of said pins.

15. The programmable integrated circuit of claim 1 further comprising:
   a plurality of pins attached to said integrated circuit; and
   a first input/output element coupled to said second set of conductors and one of said pins.

16. The programmable integrated circuit of claim 1 further comprising:
   a plurality of pins attached to said integrated circuit; and
   a first input/output element coupled to said third set of conductors and one of said pins.

17. The programmable integrated circuit of claim 1 further comprising:
   a plurality of pins attached to said integrated circuit; and
   a first input/output element coupled to said fourth set of conductors and one of said pins.

18. The programmable integrated circuit of claim 1 wherein said logic block includes:
   at least one logic generator for programmably receiving signals from said first and second sets of conductors;
   at least one storage device for receiving an output signal from said at least one logic generator and programmably supplying signals to said first, second, and third set of conductors.

19. A programmable logic array device comprising:
   a plurality of logic blocks aligned in a row;
   a first group of conductive lines disposed adjacent and above said plurality of logic blocks;
   a plurality of first conductive segments for coupling each logic block to one of said conductive lines in said first group;
   a second group of conductive lines disposed adjacent and below said row of logic blocks;
   a plurality of second conductive segments for coupling each logic block to one of said conductive lines in said second group;
   a third group of conductive lines disposed substantially perpendicular to said first and second groups of conductive lines and coupled to only one logic block; and
   a fourth group of conductive lines disposed substantially perpendicular to said first and second groups of conductive lines and coupled only to said first and second groups of conductive lines.

20. A method of coupling a logic block in a programmable logic array device comprising:
   providing bidirectional signal propagation between said logic block and a first set of conductors adjacent to a first side of said logic block;
   providing bidirectional signal propagation between said logic block and a second set of conductors adjacent to a second side of said logic block;
   providing solely unidirectional signal propagation from said logic block to a third set of conductors adjacent to a third side of said logic block;
   preventing any signal propagation from said logic block to a fourth set of conductors adjacent to a fourth side of said logic block;
   providing bidirectional signal propagation between said first set of conductors and said fourth set of conductors; and
   providing bidirectional signal propagation between said second set of conductors and said fourth set of conductors.

21. The method of claim 20 further including:
   providing bidirectional signal propagation between said first set of conductors and said third set of conductors; and
   providing bidirectional signal propagation between said second set of conductors and said third set of conductors.

* * * * *